United States Patent [19]

Heaps et al.

[11] 4,252,861

[45] Feb. 24, 1981

[54] GROWTH TECHNIQUE FOR SILICON-ON-CERAMIC

[75] Inventors: J. Don Heaps, Minnetonka; J. David Zook, Burnsville, both of Minn.

[73] Assignee: Honeywell Inc., Minneapolis, Minn.

[21] Appl. No.: 79,844

[22] Filed: Sep. 28, 1979

[51] Int. Cl.³ .......................... B05D 1/18; H01L 31/00
[52] U.S. Cl. ..................................... 428/446; 427/74; 427/75; 427/265; 427/266; 427/402; 427/443.2
[58] Field of Search ................... 427/74, 75, 265, 266, 427/402, 443.2; 428/446

[56] References Cited

U.S. PATENT DOCUMENTS

| | | | |
|---|---|---|---|
| 4,112,135 | 9/1978 | Heaps et al. | 427/74 X |
| 4,128,680 | 12/1978 | Heaps et al. | 427/74 X |
| 4,137,355 | 1/1979 | Heaps et al. | 428/446 X |

*Primary Examiner*—James R. Hoffman
*Attorney, Agent, or Firm*—Omund R. Dahle

[57] ABSTRACT

The present invention is an improvement to the method of growing silicon films on a substrate by bringing the substrate in contact with molten silicon. The improved growth technique may be classified as an asymmetric mode of growth of silicon on the substrate and is characterized by the substrate being maintained at a higher temperature than the solidification of silicon in the area of the substrate where the silicon layer growth is taking place, that is in the area of the liquid-solid interface. The higher temperature of the substrate causes the liquid-solid interface to be tilted to be nearly parallel to the substrate surface but inclined at a reentrant angle, so that the leading edge of the crystallization front is away from the substrate. This provides several advantages including increased growth speed, a nonhomogeneous doping of the silicon layer, that is an impurity concentration gradient and results in a high-low junction at the back surface and gives the back surface field effect.

7 Claims, 10 Drawing Figures

GROWTH TECHNIQUE FOR SILICON-ON-CERAMIC

BACKGROUND AND SUMMARY OF THE INVENTION

The present invention is related to the art of growing silicon films on ceramic substrates by bringing the substrate in contact with molten silicon. The present invention is broadly related to prior art U.S. Pat. Nos. 4,112,135, 4,128,680 and 4,137,355 by Joseph D. Heaps and Obert N. Tufte, all assigned to the same assignee as the present invention, where there is described apparatus and method of coating ceramic bodies or sheets with molten silicon to prepare large area, thin sheets of large grain polycrystalline silicon on inexpensive ceramic substrate for use in solar cell panels and the like. This is referred to as silicon-on-ceramic or supported growth. In that method the side of the ceramic sheet or the area to be coated with silicon is first carbon coated, i.e. carbonized. It is taught in the cited references that when a ceramic (which normally is not wet by molten silicon) is first carbonized on a surface to be silicon coated, the carbonized surface will then be wet by molten silicon, and by contacting the carbonized ceramic substrate with molten silicon, a silicon coating will be formed thereon.

The present invention is directed to an improvement over the prior art silicon-on-ceramic technique in providing increased growth speed, in providing rejection of unwanted impurities, in providing a silicon layer with a natural impurity segregation which gives a graded impurity level through its thickness, and in providing a built-in back surface field in the silicon layer that will enhance solar cell performance. The improved growth technique lies in what may be described or classified as an asymmetric mode of growth of the silicon-on-ceramic in contrast with the symmetrical mode of growth occuring in the process of the prior art patents cited above. This growth technique is classified as an asymmetric mode of growth of silicon on the substrate, because the substrate must remain hot (i.e. at a higher temperature than the solidification temperature of silicon) in the area of the substrate where the silicon layer growth is taking place so that the liquid-solid interface is nearly parallel to the substrate, but inclined at a reentrant angle, so that the leading edge of the crystallization front (first to solidify) is away from the substrate.

DESCRIPTION

Figure 1:
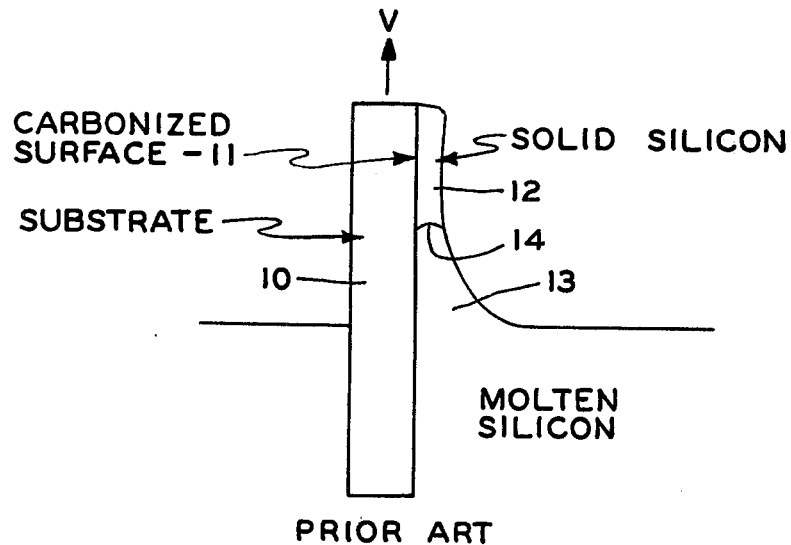
FIG. 1 is a drawing of prior art vertical supported symmetrical silicon growth.

In the prior art relating to coating large grain silicon-on-ceramic from the melt there is taught the method of contacting a carbonized surface of a ceramic substrate with molten silicon to form a silicon coating on the carbonized ceramic surface. One specific method of contacting the ceramic substrate with molten silicon described in these prior art patents is by dip coating. Referring now to FIG. 1 which shows a prior art process for providing a supported growth of large grain polycrystalline silicon on a ceramic substrate, there is shown a substrate of ceramic 10 having a surface 11 which has been carbon coated (the carbon coated surface will be wet by molten silicon). The substrate 10 has been dipped into molten silicon and is being withdrawn upwardly at a rate V. On the carbonized surface 11 a silicon coating 12 grows as the substrate is withdrawn from the silicon melt. The molten silicon is drawn up into a meniscus 13 at the carbon coated surface 11 and the crystallization of the silicon onto the substrate occurs in this meniscus at a liquid-solid interface 14.

Figure 1A:
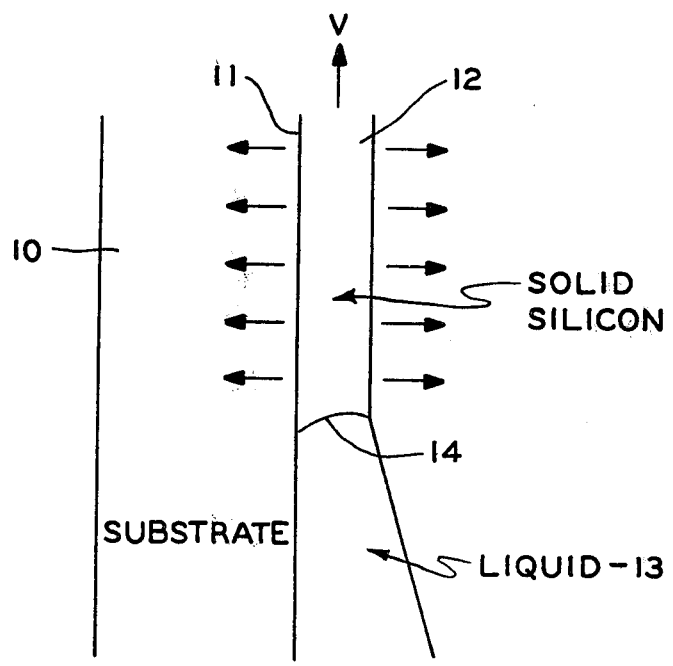
FIG. 1a is an enlargement of a portion of FIG. 1.

FIG. 1a is an enlargement of the portion of FIG. 1 in the area of the liquid-solid interface 14 and also shows heat flow patterns from the solid silicon 12 by the use of a series of arrows. FIG. 1a shows that the solidification takes place at a liquid-solid interface 14 in which the interface angle is close to 90° to the surface 11. This 90° case is called the symmetric mode of growth. In this mode the radiation environment is essentially symmetric and thus heat is removed from the silicon approximately equally on both sides of the silicon sheets, and growth occurs in the symmetric mode.

Asymmetric Growth

Figure 2:
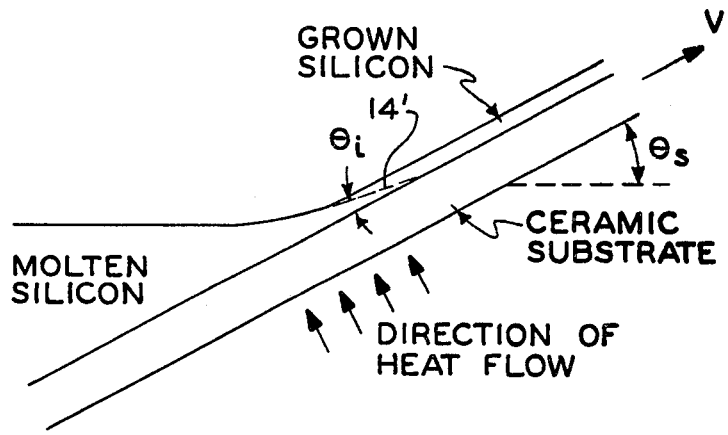
FIG. 2 shows diagrammatically the basic concept of the asymmetric hot substrate growth; and, FIGS. 2a and 2b are enlargements of a selected portion of FIG. 2 to enhance the description.
Figure 2A:
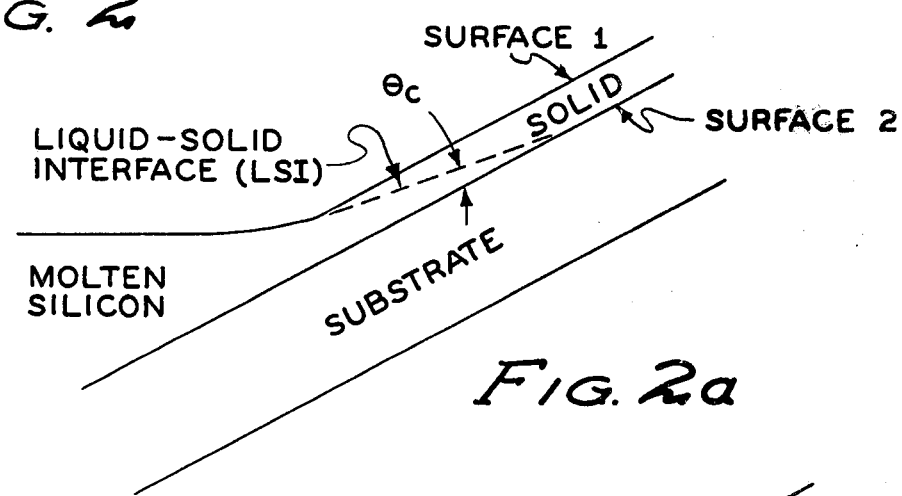

Referring now to FIG. 2 the basic concept of the hot substrate growth is shown. Molten silicon is brought into contact with a moving ceramic substrate that is inclined at an angle $\theta_s$. The substrate 10 is kept hot during the growing of the silicon coating so that the liquid-solid interface 14' is tilted to be inclined at a small angle $\theta_i$ (nearly parallel) to the as-grown silicon surface 1. This is shown in more detail in the enlargement of FIG. 2a.

An advantage of this geometry with respect to speed is that the growth interface is growing at a velocity v which is much lower than the pull rate v. This is possible because the growth surface is much larger than the layer crossectional area.

A unique advantage of this concept with respect to undesired impurities is that at the lower growth velocity the segregation coefficient will effectively reject the impurities, pushing them toward the ceramic interface where they will not affect solar cell performance.

A further unique feature of this concept is that the desired dopant may be chosen to have a reasonably low segregation coefficient. For example, to dope p-type, aluminum can be used with a segregation coefficient of $10^{-3}$. In Czochralski growth this type of impurity is undesirable because the impurities are rejected by the solid, so that the concentration in the liquid keeps changing, giving a nonhomogeneous doping.

In a solar cell this nonhomogeneous doping can be used to advantage. This advantage relates to the natural impurity segregation. The top as-grown surface turns out to be very lightly doped, and, as dopant atoms are rejected towards the ceramic, the concentration increases. This results in a high-low junction at the back surface, and gives the BSF (back surface field) effect which is known to increase solar cell $V_{oc}$, $J_{sc}$ and efficiency, and provides a low resistance back contact to the base region.

A useful feature of this approach is that by keeping the angle $\theta_i$ small, the impurities, both desired and undesired do not have a chance to diffuse into the bulk of the melt. This minimizes progressive contamination of the melt.

Figure 2B:
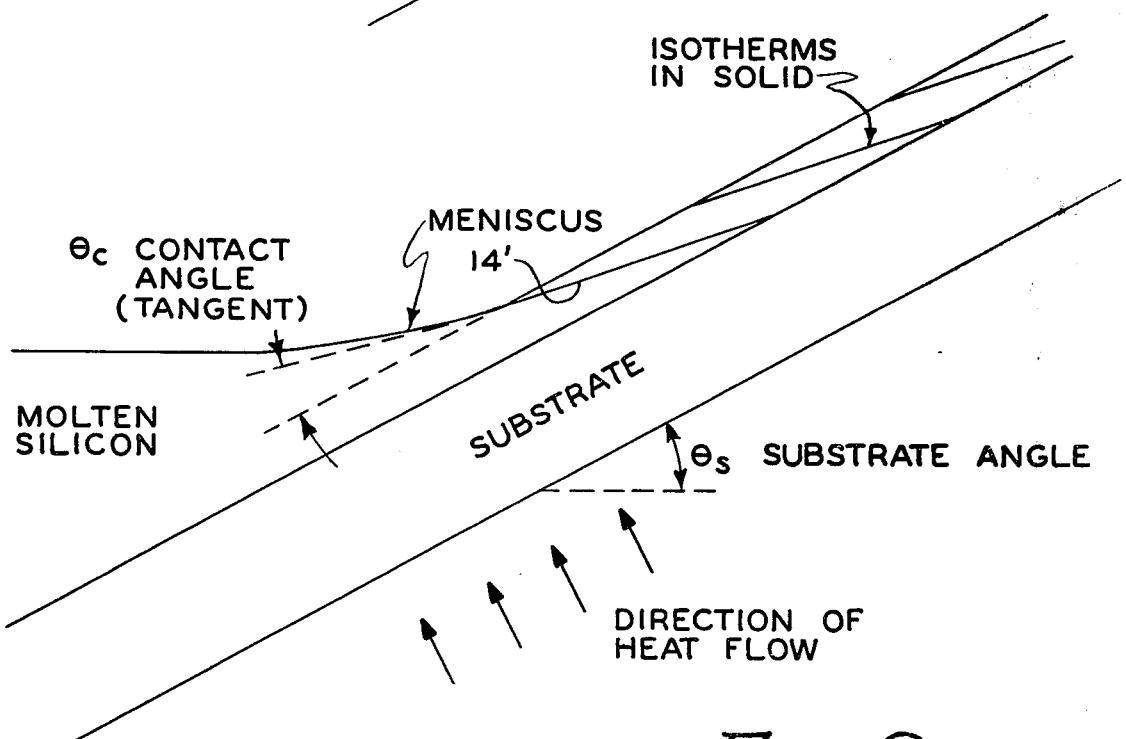

Another useful advantage to pulling at an angle such as described lies in that fact that heat conduction is basically perpendicular to the isotherms. The isotherms are parallel to the liquid-solid interface as is shown in more detail in FIG. 2b. Thus the heat need be conducted essentially only the thickness of the silicon. As can be seen in FIG. 2b the angle $\theta_c$ (which is the angle between the liquid-solid interface and the surface 1 of the solid silicon) is less than the angle $\theta_s$. The angles $\theta_s$ and $\theta_i$ preferably should be much smaller than that represented in the drawing. This improved heat dissipation makes possible an increased growth speed.

Figure 3:
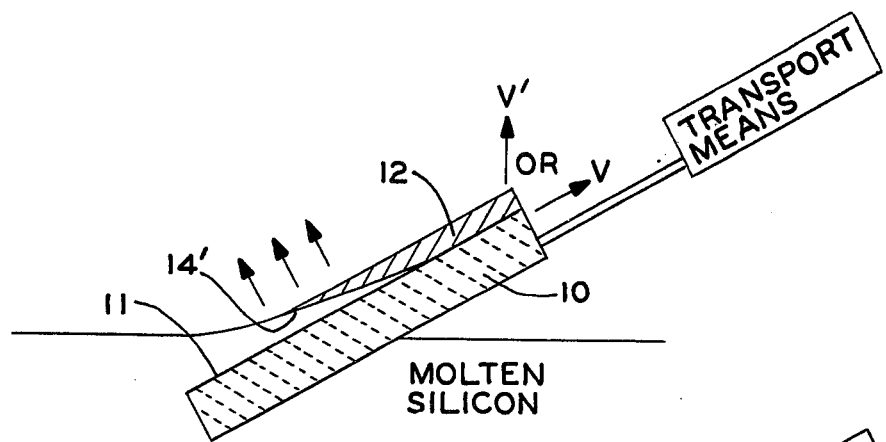
FIG. 3 shows one embodiment of asymmetrical polycrystalline silicon layer hot substrate growth by non-vertical dip coating.

Several embodiments of the asymmetric growth are shown in the next three figures of the drawing. Referring now to FIG. 3 there is disclosed a non-vertical dip coating embodiment in which the ceramic substrate 10 is immersed in molten silicon. In withdrawing the substrate from the silicon melt (by transport means shown in block diagram form) the direction of the velocity may be along the length of the substrate as shown by V or may be vertical as shown v'. An asymmetric growth occurs on the carbonized substrate surface 11 providing a polycrystalline silicon layer 12 having the properties described in FIGS. 2, 2a and 2b. The asymmetric liquid-solid interface 14' can occur in this embodiment because the substrate in the region of interface 14' is maintained hot from beneath by still being immersed in the molten silicon so that the heat flow from the silicon layer is basically upwardly from the upper surface of the silicon layer 12. It is also to be understood that the same asymmetric growth concept may be implemented in a vertical dip coating configuration by having a substrate heater located near the back of the emerging substrate and cooling shoes located near the carbonized front side of the substrate.

Figure 4:
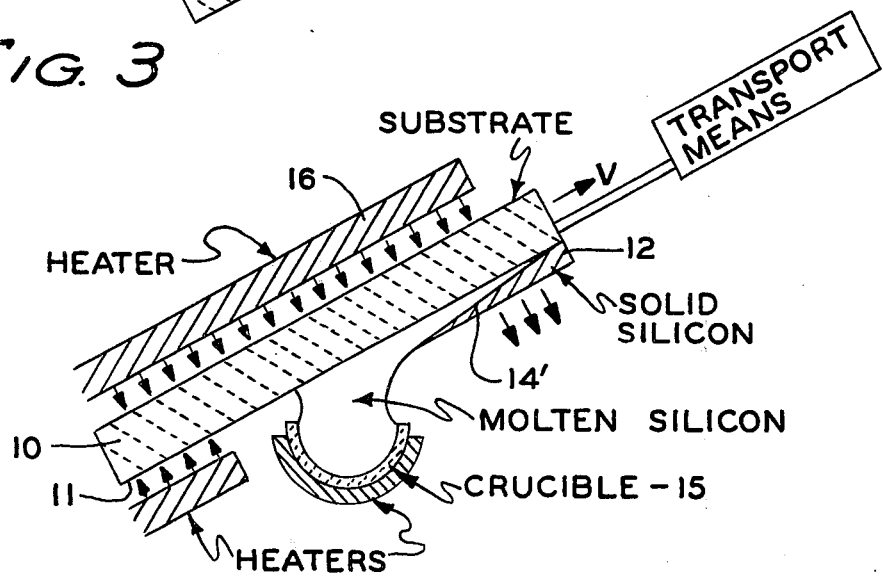
FIG. 4 shows another embodiment of asymmetrical silicon layer hot substrate growth.

Referring now to FIG. 4, another embodiment of asymmetrical growth is shown in which the substrate 10 with carbonized surface 11 facing downwardly is supported and moved by transport apparatus shown, (and with the direction of the velocity V indicated by an arrow) over the top surface of the molten silicon. The silicon melt is shown in an elongated crucible 15 containing a protruding meniscus of the molten silicon. The meniscus of silicon makes contact with surface 11 of the moving substrate to grow the silicon layer 12 on the substrate. In this embodiment a substrate heater 16 is shown as being positioned above the substrate 10 and extending to a point near the solidification interface to provide a hot substrate at the area of liquid-solid interface 14' so that the heat of fusion flows downwardly from the silicon as indicated by the triple arrows. Thus with the exposed surface of the silicon layer being at the lowest temperature, solidification begins at the exposed silicon surface and proceeds back toward the substrate.

As in dip-coating, the thickness of the silicon layer achieved in the inclined horizontal coating procedure of FIG. 4 is dependent upon the rate at which the heat of fusion is extracted from the layer and is dependent upon the velocity at which the layer is growing. If thermal conditions within the solidification zone are such that the liquid-solid interface lies in a plane perpendicular to the surface of the substrate (as described in FIG. 1a), the growth rate of the crystalline layer and throughput rate of the coated layer are identical. The angle of the solidification front can, however, as herein described, be tilted toward the substrate, by altering thermal conditions in the solidification zone to incorporate large assymmetry in the heat flow from the two sides of the silicon layer during growth. Heater 16 provides this altered thermal condition so that the latent heat of fusion is removed by conduction away from the substrate (hot substrate growth). Whenever the plane of this front is substantially away from the normal to the substrate, the throughput rate will be substantially greater than the crystalline growth rate.

Figure 5:
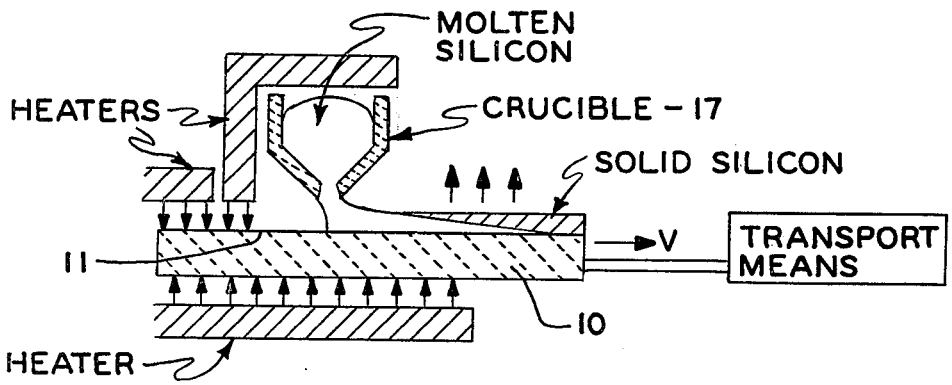
FIG. 5 shows still another embodiment of asymmetrical silicon layer hot substrate growth.

Referring now to FIG. 5 there is disclosed still another embodiment of asymmetric growth in which the ceramic substrate 10 with carbonized surface 11 facing upwardly is supported and moved, by transport apparatus shown in block diagram form, beneath a crucible 17 dispensing molten silicon onto the surface of the substrate. Again in this embodiment to incorporate a large asymmetry in the heat flow from the two sides of the silicon layer during growth, the substrate is maintained hot in the region where silicon solidification is occurring. This is accomplished by heater 20 underneath substrate 10 and which heater extends laterally to the right in the drawing to a point below substrate 10 which is opposite where solidification of the silicon is occuring. Thus as shown by the triple arrows the latent heat of fusion is removed by conduction away from the substrate, a large asymmetry in the heat flow from the two sides of the silicon layer during growth is again provided.

Although the above description of asymmetric growth has been stated in terms of the silicon layer on a ceramic substrate it will be understood that other suitable substrates may also be used, for example, a carbon substrate.

Analytical Consideration of Asymmetric Growth

Figure 6:
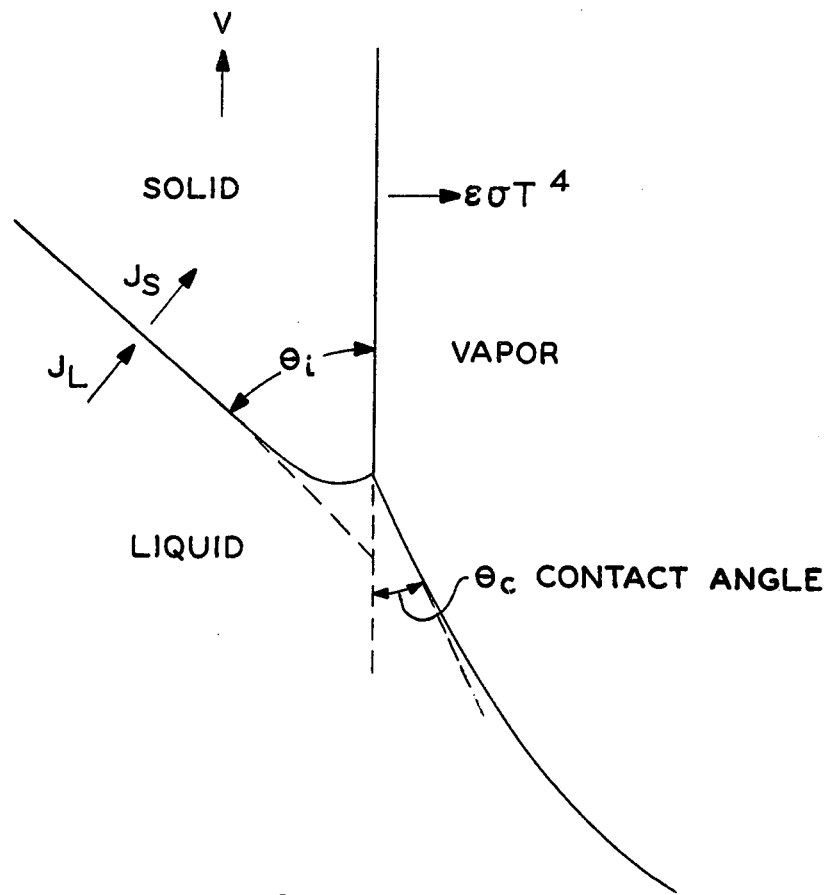
FIG. 6 is a drawing of liquid-solid-vapor configuration in the vicinity of the tri-ion between the three phases; and, FIG. 7 shows the advance of the solid-liquid interface.

The purpose of this section is to present a simplified thermal analysis which shows that the asymmetric "hot substrate" type of growth is quite distinct from the usual symmetric type growth. The analysis is based on the following assumptions:

1. The liquid-solid interface (LSI) is an isotherm. The temperature of the isotherm is defined to be $T_F$, the freezing temperature.
2. The LSI is essentially planar, having a large radius of curvature (R>1 cm). There could be a small region (on the order of microns) near the trijunction where curvature can exist as illustrated in FIG. 6.
3. The pulling velocity v (with which the growing layer is withdrawn from melt in the region of interest for sheet growth) is greater than 0.05 cm/sec.
4. The heat flux density $J_L$ in the liquid is small compared to that in the solid $J_S$.
5. Heat transfer from the free surface is dominated by radiation according to the Stefan-Boltzman law: $\epsilon\sigma T^4$ The first part of the thermal analysis argument is to derive the boundary condition at the liquid-solid interface. This condition is well known, but is derived here for continuity of the analysis.

Figure 7:
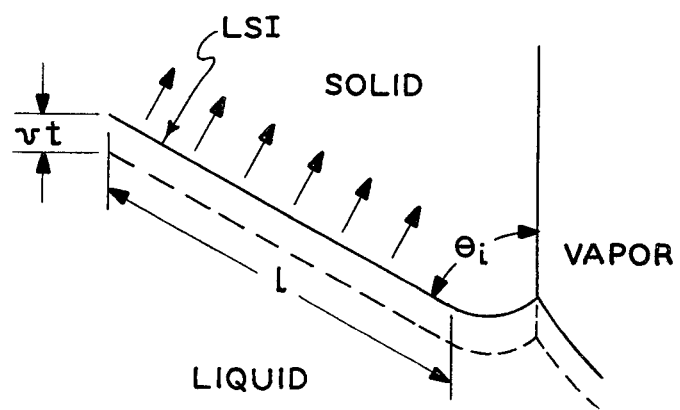

FIG. 7 shows the advance of the liquid-solid interface during growth. In a time t the solid advances a distance vt. The volume solidified in time t is (vt 1 w) sin $\theta_i$, where w is the width of the sheet (perpendicular to the figure). The heat energy liberated is ($\rho$Lvt 1 w) sin $\theta_i$. This heat must be equal to the heat carried away by conduction, ($J_S - J_L$) 1 wt. Equating the two expressions gives $$J_s = J_L + \rho L v \sin \theta_i. \quad (1)$$

In the high speed limit $J_L$ will be negligible compared to $J_s$ (assumption 4 above), giving $$J_s = \rho L v \sin \theta_i. \quad (2)$$

Since the liquid-solid-interface is an isotherm (assumption 1) the heat flow is perpendicular to it. The horizontal component is $J_L \cos \theta_i$, which must equal the heat loss at the boundary: $\epsilon \sigma T_F^4$, by assumption 5. Thus:

$$\rho L v \sin \theta_i \cos \theta_i = \epsilon \sigma T^4. \quad (3)$$

where $T_F$ is the freezing temperature of silicon (1685° K).

The value of $\theta_i$ is then given by $$\sin \theta_i \cos \theta_i = \frac{\epsilon \sigma T_F^4}{\rho L v} = \delta \quad (4)$$

With a value of v=0.05 cm/sec. (assumption 3) the numerical value of $\delta$ is about 0.1, so that $$\sin \theta_i \cos \theta_i = \tfrac{1}{2} \sin 2\theta_i = \delta < 0.1 \quad (5)$$

This equation for $\theta_i$ has two solutions: $\theta_i = 90° - \delta$ and $\theta_i = \delta$, corresponding to vertical type growth and hot substrate growth, respectively.

$$\theta_i = \begin{cases} \delta & \text{Hot substrate-type growth} \\ 90° - \delta & \text{Symmetrical-type growth} \end{cases} \quad (6)$$

The embodiments of the invention in which an exclusive property or right is claimed are defined as follows:

1. An improved method for growing a layer of polycrystalline silicon on a substrate from a source of molten silicon comprising the steps of:
   providing a source of molten silicon;
   providing a substrate to grow a silicon layer on;
   transporting the substrate with respect to and proximate the molten silicon whereby contact is made between the molten silicon and the substrate surface causing a silicon layer to grow on said surface; and
   tilting the solid-liquid interface of the growing silicon layer to be substantially parallel with the outer surface of the layer by heating the substrate from the non-coated side to provide a heat flow through the substrate, to, through and out of the outer surface of the silicon layer.

2. The method according to claim 1 in which the substrate to grow the silicon layer on is a ceramic and in which the ceramic substrate has a surface thereof carbon coated where it is desired that the silicon layer grow.

3. The method according to claim 2 and wherein the step of transporting the substrate further comprises:
   immersing the substrate in molten silicon;
   removing the substrate from the melt in a non vertical position with the carbon coated surface of the substrate facing upwardly;
   growing a silicon layer on the emerging carbon coated surface of the substrate;
   and wherein the heating of the substrate from the non-coated side is by way of the still immersed lower face of the substrate opposite the area where solidification of silicon is occuring.

4. The method according to claim 2 wherein the step of providing a source of molten silicon further comprises:
   providing an elongated crucible for containing the molten silicon;
   maintaining the level in the crucible such that the silicon surface rises up from the crucible surface in a convex meniscus;
   and wherein the step of transporting further comprises:
   supporting the substrate with the carbon coated surface facing downwardly;
   traversing the downwardly facing surface of the substrate over and across the surface of the molten silicon meniscus with the surface making contact with the silicon meniscus as the substrate traverses to grow a silicon layer as the carbonized surface emerges from contact with the silicon meniscus;
   and wherein the step of tilting the interface by heating the substrate further comprises:
   providing a heater above the substrate in the region where silicon growth is occuring.

5. The method according to claim 1 wherein the step of providing a source of molten silicon further comprises:
   providing an elongated crucible for containing the molten silicon;
   maintaining the level in the crucible such that the silicon surface rises up from the crucible surface in a convex meniscus;
   and wherein the step of transporting further comprises:
   supporting the substrate with the surface to be coated facing downwardly;
   traversing the downwardly facing surface of the substrate over and across the surface of the molten silicon meniscus with the surface making contact with the silicon meniscus as the substrate traverses to grow a silicon layer as the surface emerges from contact with the silicon meniscus;
   and wherein the step of tilting the interface by heating the substrate further comprises:
   providing a heater above the substrate in the region where silicon growth is occuring.

6. A silicon layer on a substrate, said layer having an impurity concentration gradient, made according to the method of claim 1.

7. An improved method for growing a layer of polycrystalline silicon on a substrate from a source of molten silicon comprising the steps of:
   providing a source of molten silicon;
   providing a substrate to grow a silicon layer on said substrate having a surface area thereof of carbon where it is desired that the silicon layer grow;
   transporting the substrate with respect to and proximate the molten silicon whereby contact is made between the molten silicon and the carbon surface of the substrate causing a silicon layer to grow on said surface; and further heating an area of the substrate in the region of silicon solidification from the non-coated side to provide heat flow through the substrate to, through and out of the outer surface of the silicon layer whereby because of the heat flow pattern, solidification of the silicon layer commences at the outer surface and progresses inwardly towards the substrate resulting in an increasing impurity level gradient from outer surface to substrate surface of the silicon layer.

* * * * *